United States Patent [19]
Haggerty

[11] 3,943,324
[45] Mar. 9, 1976

[54] APPARATUS FOR FORMING REFRACTORY TUBING

[75] Inventor: John S. Haggerty, Lincoln, Mass.

[73] Assignee: Arthur D. Little, Inc., Cambridge, Mass.

[22] Filed: Dec. 27, 1972

[21] Appl. No.: 318,911

Related U.S. Application Data

[63] Continuation-in-part of Ser. No. 97,603, Dec. 14, 1970, abandoned.

[52] U.S. Cl. ......... 219/121 L; 219/349; 23/273 SP; 23/301 SP
[51] Int. Cl.[2]........................................ B01J 17/00
[58] Field of Search ............ 65/108, 109, 110, 337, 65/134, 32; 23/301 SP, 273 SP; 148/1.6; 408/71; 219/121 L, 121 LM, 347, 349

[56] References Cited
UNITED STATES PATENTS

| | | | |
|---|---|---|---|
| 2,861,166 | 11/1958 | Cargill | 219/121 LM |
| 3,086,856 | 4/1963 | Siebertz | 148/1.6 X |
| 3,249,414 | 5/1966 | Hamilton | 65/110 |
| 3,278,274 | 10/1966 | Liebmann et al. | 23/301 SP |
| 3,434,818 | 3/1969 | Chauvin | 65/110 X |
| 3,517,159 | 6/1968 | Milochevitch | 219/121 L |
| 3,552,931 | 1/1971 | Doherty et al. | 408/71 |
| 3,603,766 | 9/1971 | Kino et al. | 219/349 |
| 3,622,740 | 11/1971 | Ravussin et al. | 219/121 L |
| 3,660,062 | 5/1972 | Keller | 65/32 |
| 3,761,677 | 9/1973 | Mizutani et al. | 219/349 |

FOREIGN PATENTS OR APPLICATIONS

1,226,473 3/1971 United Kingdom

OTHER PUBLICATIONS

J. B. Gunn, "Method of Zone Melting", IBM Technical Disclosure Bulletin, Vol. 10, No. 1, 6/1967.

Primary Examiner—J. V. Truhe
Assistant Examiner—Clifford C. Shaw
Attorney, Agent, or Firm—Bessie A. Lepper

[57] ABSTRACT

Refractory tubings approaching theoretical density, either in polycrystalline or single crystal form, are made by moving a preformed tubing of a refractory material and a heated zone relative to each other, the heating zone providing sufficient heat to melt through the tubing and form a molten ring which is continuously advanced through the tubing. The heat source may be located externally or internally of the tubing wall or in both positions. The tubings may be formed as single crystals; and by controlling the rate of movement of the tubing sections on either side of the molten ring the wall thickness and diameter of the final tubing may be adjusted.

15 Claims, 21 Drawing Figures

APPARATUS FOR FORMING REFRACTORY TUBING

This application is a continuation-in-part of my application Ser. No. 97,603 filed Dec. 14, 1970, now abandoned.

This invention relates to method and apparatus for forming refractory materials into the form of tubing, and more particularly to forming refractory tubing in single crystal or polycrystalline forms.

The term "refractory" is used hereinafter to designate materials which have relatively high melting points and which may or may not be highly corrosive. The term is meant to include amorphous and crystalline materials, including single crystal and polycrystalline forms; compounds such as alumina, thoria, zirconia, ytteria, etc.; intermetallics such as gallium arsenide and pseudobinary compounds such as AlAs-GaAs; as well as elements such as germanium and silicon. Any refractory suitable for this invention must be capable of existing in a molten state.

Although a number of refractories have been made into tube forms by conventional powder processes, at present alumina is the most important of these refractories where high-temperature strength, high electrical resistivity and chemical inertness are required. Therefore, alumina may be taken as exemplary in discussing prior art and utility. It is, of course, possible that other refractory materials, particularly the oxides of yttrium, zirconium and thorium, can be used in a manner similar to that in which alumina is now employed.

An important application for alumina tubing is enclosures for high-pressure sodium-halide lights. The emitted light from a high-pressure sodium-halide (normally sodium iodide) light is more pleasing than the yellow light emitted by low-pressure sodium vapor lamps. Moreover, these lamps are smaller and more efficient than alternative lamps such as mercury vapor lamps or fluorescent sources. At the increased operating temperatures characteristic of the high-pressure sodium lamps, the gases become too corrosive to permit the use of previously acceptable vitreous silica enclosures. These more severe conditions have led to the use of alumina enclosures which are formed either by sintering the alumina in the desired configuration, or by adaptation of the Czochralski crystal pulling technique.

Even with the most sophisticated sintering techniques, the sintering process rarely produces materials which attain full or theoretical density. Such failure to attain full density means that alumina tubes or envelopes formed by sintering alone probably have residual porosity which provides light scattering sites, thus detracting from the efficiency of any lamps formed from the sintered tubing.

To minimize porosity in materials produced by this prior art sintering technique, it is necessary to fire the pieces in an atmosphere made up of a gas which has a sufficiently high solubility and mobility for diffusion of the gas entrapped in closed-off pores out of the sintered material. Such an atmosphere is, for practical purposes, limited to hydrogen. Alternatively, the sintering may be done in a vacuum. Thus in the prior art processes, there is virtually no freedom to select ambient atmospheres to maximize purification of the final tubing material or to attain other desirable results such as the ability to adjust the valence state of intentially added dopants, additives or of residual impurities.

It may be desirable to be able to form such tubing of a single crystal. If the material is not optically isotropic, for example materials having hexagonal crystal structures, the presence of a plurality of different grain boundaries in the optical path will degrade the potential image quality of transmitted light. This is not the case with cubic crystals which are optically isotropic. However, grain boundaries in most materials act as concentrators as well as high-mobility path of impurities.

The adaptation of the Czochralkski method of growing crystals to the formation of tubing by pulling the tubing from a hot melt contained in a hot crucible presents the serious disadvantage of introducing contaminants into the tubing from the crucibles. Such contaminants may interact with the active gases within the lamp enclosure serving as "getters" for these small quantities of gases or they may increase the total absorption across the emitted spectrum of the lamp thus decreasing its efficiency. Ambient atmospheres must be limited to those which do not result in degradation of the crucible. Finally, there are many materials for which no known crucible material exits.

The principal disadvantages of the prior art methods— failure to attain full density with the resulting undesirable degree of porosity, introduction of impurities, and restrictions imposed on processing atmospheres — are minimized or eliminated by the method and apparatus of this invention.

It is therefore a primary object of this invention to provide an improved method for forming refractory tubing. It is another object to provide a method of the character described which makes possible the forming of refractory tubings of materials exhibiting full density or near full density and hence of materials in which light scattering sites are reduced to a minimum. Another object is the providing of such a method which makes it possible to make refractory tubing of extremely high purity. It is yet another object of this invention to provide a method for forming refractory tubing containing additives, the valence state of which may be adjusted. An additional object is to provide a method of the character described which makes possible, if desired, formation of refractory tubings in single-crystal form. It is yet another object of this invention to provide a method of forming refractory tubing, the cross sectional configuration and wall thickness of which may be varied. It is another object of this invention to provide such a method which is applicable to a wide range of high-temperature materials including those normally considered to be too corrosive to be contained in crucibles.

It is another primary object of this invention to provide improved apparatus for forming refractory tubing which attains full density or near full density and a high degree of purity. It is another object to provide apparatus of the character described which permits the selection of the ambient atmosphere in which the tubing is formed, an advantage which in turn gives rise to the ability to select the valence state of additives such as dopants. Yet another object is to provide apparatus which makes it possible to form tubings of single crystals if desired. The invention has as still another object the providing of apparatus suitable for forming refractory tubings of a wide range of materials. Other objects of the invention will in part be obvious and will in part be apparent hereinafter.

In the method of this invention a zone of concentrated heat is provided, a preformed refractory tubing is positioned within the heating zone and then relative motion is effected between the heating zone and the refractory tubing to form a continuously advancing ring of molten refractory in the tubing. The heating zone may be formed externally of the tubing, internally of the tubing or as a combination of both. It must, of course, be of a width no greater than that which permits the two solid tubing sections to be continuously joined by the molten ring through the forces of gravity and surface tension. When each end of the tubing is separately held and when separate moving means are associated with one or both of the two solid sections (one on each side of the molten ring) it is possible by adjusting the speed of one of the moving means relative to the speed of the other moving means or the speed at which the heating means are moved to control the thickness of the final tubing wall. Other method modifications are also possible.

In brief, the apparatus of this invention comprises means to provide a heating zone external of a refractory tubing, internal of the refractory tubing or a combination of both, and means to move the tubing and heating zone relative to each other. It may also include means to provide different rates of translational motion for each section of the tubing on the two sides of the molten ring as well as means to provide a controlled fluid atmosphere around the system.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

For a fuller understanding of the nature and objects of the invention, reference should be had to the following detailed description taken in connection with the accompanying drawings in which.

There is, of course, a great deal of prior art on float-zone melting of solid rods of various materials. See for example "Zone Melting" by William G. Pfann, John Wiley & Sons, Inc., New York, New York, 158, and U.S. Pat. No. 3,121,619. However, this technique has not previously been applied to the formation of tubings which presents particular problems not encountered in the processing of solid rods. such problems include the maintenance and adjustment of wall thicknessses, the maintaining of a desired cross section of tubing, and the like. Tubings have also been pulled from molten material contained within a crucible as shown in U.S. Pat. No. 3,015,592. The physics, as well as the apparatus, of the floating zone process are completely different from the crucible-contained process.

Figure 1:
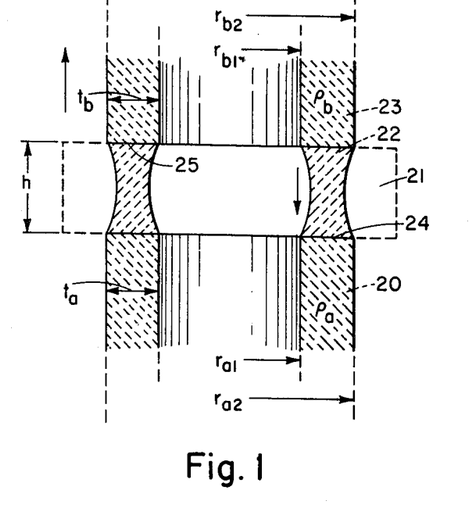
FIG. 1 is an enlarged longitudinal cross section of the tubing during formation wherein the finished refractory tubing has essentially the same wall thickness as the preformed feed tubing.

Before describing various embodiments of the method and apparatus of this invention, it will be helpful to present the method generally with reference to FIG. 1 which is an enlarged longitudinal cross section of the molten zone forming sections of the system. As a solid preformed tubing feed blank 20 (generally formed by pressing the refractory powder and presintering if necessary) is moved upwardly through a heating or melt zone 21 a ring 22 of molten refractory is formed and continuously, in effect, advances through the tubing in a downwardly direction, forming a refractory tubing 23. The dimensions of melt zone 21 was defined by the energy input distribution which in turn is determined by the nature of the input power, the thermal losses into the feed and drawing rods and the thermal losses to the surrounding environment.

The height $h$ of the heating zone must be so controlled through the adjustment of these parameters, and the solid sections 20 and 23 of the tubing must be moved at such a rate as to always keep them joined through molten ring 22 which effects such joining through the force of surface tension and gravity.

The solid preformed feed tubing 20 has an internal radius of $r_{a-1}$, an external radius of $r_{a-2}$, a wall thickness of $t_a$ and a fractional density of $\rho_a$. In like manner, the solid tubing 23 has an internal radius of $r_{b-1}$, an external radius of $r_{b-2}$, a wall thickness of $t_b$ and a fractional density of $\rho_b$, generally 100%. In order to establish aa stable system permitting the continuous advancement of molten ring 22, the mass flow rate crossing the solid-liquid boundary 24 between tubing feed section 20 and molten ring 22 and the mass flow rate crossing the liquid-solid boundary 25 between molten ring 22 and tubing section 23 must be equal.

Figure 2:
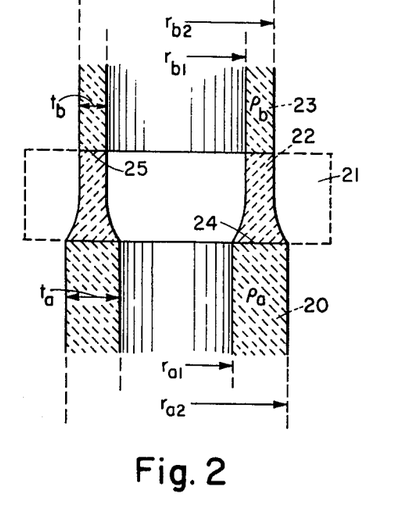
FIG. 2 is an enlarged longitudinal cross section of the tubing during formation wherein the finished refractory tubing has an attenuated wall thickness.

Since the velocities at which the tubing feed section 20 and the tubing section 23 are moved may be separately controlled one being in effect raised, the other being pulled, it is possible to adjust the wall thickness, and to some extent the outside diameter of the tubing formed, by moving the tubing section 23 at a greater or lesser velocity. The situation diagrammed in FIG. 2 shows how the wall thickness may be attenuated by moving section 23 faster than section 20.

Since the mass flow rate is equal to the product of factional density, cross sectional area and velocity, the required stable system is attained when $$\pi(r_{a-2}^2 - r_{a-1}^2)\rho_a v_a = \pi(r_{b-2}^2 - r_{b-1}^2) \rho_b v_b$$

where $v_a$ and $v_b$ are the velocities at which the tubing sections are moved. Assuming that the fractional densities of both tubes are substantially 100%, and that $r_{b-2}$ is essentially equal to $r_{a-2}$, then $$2\pi r_{a-2} t_a \rho_a v_a = 2\pi r_{b-2} t_b \rho_b v_b.$$

By increasing $v_b$ it is possible to decrease $t_b$, or by decreasing $v_b$ it is possible to increase $t_b$, so long of course as the basic requirement is met that the two sections are continuously joined through the molten ring. Thus there is provided a way of controlling the wall thickness of the finished refractory tubing.

The inside and outside diameters of the final tubing are functions of zone height and dimensions of the feed tube. If there is no attenuation during the formation of the final tubing, the resulting tubing will generally have a somewhat small diameter and a greater wall thickness. With attenuation, it is possible to change the relationship between the outside diameter and wall thickness; but the outside diameter of the growing tube will always to equal to or smaller than the outside diameter of the feed tube.

Figure 3:
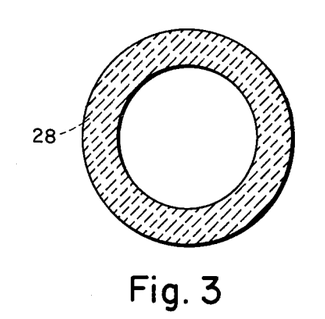
FIGS. 3 and 4 are typical cross sections taken in a plane normal to the tubing axis.
Figure 4:
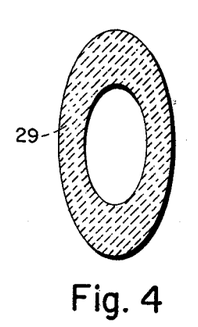

It is, of course, within the scope of this invention to form refractory tubings having a range of cross sectional configurations in which the wall thickness may be uniform or nonuniform. Exemplary of a circular cross section of uniform wall thickness is tubing 28 of FIG. 3, and of an eliptical cross section with nonuniform wall thickness is tubing 29 of FIG. 4. The ultimate cross sectional configuration may be controlled in forming the feed tubing blank and to some extent by the design of the heating zone.

Although it is possible to start the growth of the final tubing by placing the feed tube in the melting zone so that melting is begun somewhere intermediate between the ends of the feed tube, it is usually more desirable to begin the melting at one end of the feed tube. To do this, it is necessary to bring one end of the feed tube located in the melt zone into contact with a contacting surface member which is affixed to a load-bearing rod such as the rod described in connection with FIG. 9. With the melting of the end of the feed tube and the formation of a melt in the contacting surface it is possible to make contact and "weld" the tubing to the contacting surface member. The contacting surface member may take any desirable form and may, in some instances, serve as a seed to start the formation of a singlecrystal tubing. Three exemplary forms of contacting surface members are shown in FIGS. 5–8.

Figures 5, 6, 7:
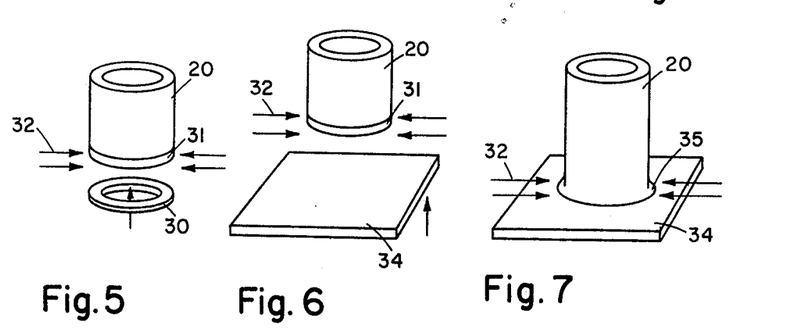
FIG. 5 illustrates in diagramatic perspective the use of a ring to start the melting of the tubing at one end.
FIGS. 6 and 7 illustrate in diagrammatic perspective the use of a flat plate to start the melting of the tubing at one end.

In FIG. 5 the contacting surface member 30 is in the form of an annular ring (or other suitable cross section) of any desired length which is brought into contact with a molten ring 31 formed on one end of the feed tubing 20 while the end of the tubing is in the heating zone and it heated by means diagrammatically represented by arrows 32. FIGS. 6 and 7 illustrate the use of a contacting surface member in the form of a flat plate 34 which, like the annular ring 30, is contacted with molten ring 31 in the heating zone. Subsequent to contacting the tubing molten ring 31 to the contacting surface member, the process of tubing formation is continued as described. When the flat plate 34 is used as a seed crystal, a joint 35 may be formed, as shown in FIG. 7, and later removed.

Figure 8:
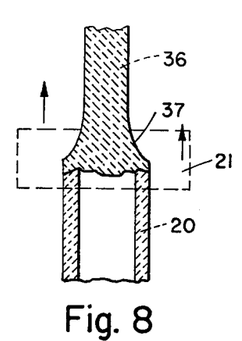
FIG. 8 illustrates the use of a rod to start the melting of the tubing at one end.

In FIG. 8, the contacting surface member is a rod 36, the end 37 of which is melted and joined to the molten end of feed tube 20. In many cases, the rod has been found to be a preferred form of surface contacting member since it appears to form a stronger weld with the feed tube.

Many different sources of heat may be used to form the required heating zone and the selection of the heating means will usually depend upon the specific refractory material used. Such heat sources include, but are not necessarily limited to, infrared sources such as incandescent filaments, arcs, imaged arcs and lasers; electron beams, gas discharge systems and direct r.f. coupling. FIGS. 9–18 illustrate exemplary heating systems to provide external and internal heating.

Figure 9:
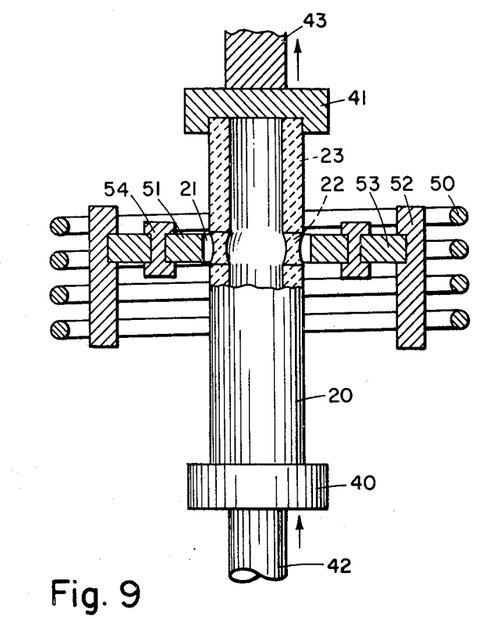
FIG. 9 is a perspective, partly in cross section, of an apparatus in which the heating zone is provided through the use of an incandescent heater heated by an r.f. coil.

In the apparatus illustrated in FIG. 9, in which like reference numerals are used to refer to like elements in FIG. 1, means are provided for external heating and for moving the tubing while maintaining the heating zone and its heating means stationary. The feed tubing 20 in this case is moved upwardly through the heating zone 21 and the ends of the tubing are held in chucks 40 and 41 which are affixed to load bearing rods 42 and 43, respectively. Means, not shown, are provided to impart translational, and if desired rotational, motion to the load-bearing rods 42 and 43, and through them to the two sections of the tubing. Suitable apparatus for moving such load-bearing rods at desired axial (and angular) velocities are described in copending application Ser. No. 653,478, which is now U.S. Pat. No. 3,552,931, assigned to the same assignee at this application. In the apparatus of U.S. Pat. 3,552,931 the rods are moved by separate mechanisms, making them particularly suitable for achieving the adjusting of wall thickness as discussed with reference to FIG. 2.

Figure 13:
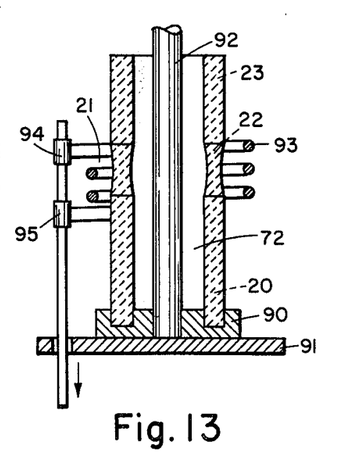

In the apparatus of FIG. 9 heating is done by means of an r.f. coil 50 inductively coupled to a graphite ring 51 (which in effect becomes an incandescent filament) through water-cooled copper electrodes 52, field concentrating ring 53 and a boron nitride insulator ring 54. A modification of the apparatus of FIG. 9 is suitable for making tubing of electrically conducting materials by direct inductive coupling of the feed tubing 20 with the field concentrating ring 53 or directly with the r.f. coils as shown in FIG. 13. The feed tubing material must, however, be electrically conducting at appropriate frequencies and temperatures; and in such a system the frequency of the r.f. heating system must be adjusted with respect to wall thickness.

The apparatus of FIG. 9 may be operated in other modes as well. The load-bearing rods 42 and 43 may be rotated at the same angular velocity to insure very even distribution of heat into the tubing and hence a uniformly heated molten ring 22. In another operational mode, assuming that the tubing is moving upwardly, rod 43 may be moved upwardly at a rate greater than that at which rod 42 is moved upwardly, thus resulting in a final tubing wall thickness less than that of the preformed feed tubing. Making the same assumptions as stated above, rod 43 may be moved upwardly at a rate less than that at which rod 42 is moved upwardly, thus resulting in a final tubing wall thickness greater than that of the preformed tubing. It is also of course, possible to reverse the direction of travel of the tubing and to make corresponding adjustments in the rates at which rods 42 and 43 are moved.

If, instead of moving the entire tubing, the heating means are moved in FIG. 9, then by holding both solid tubing sections 20 and 23 stationary, or by rotating them without effecting any translational motion, the wall thickness of the final tubing will be essentially that of the feed tubing provided the fractional density of the feed tubing approached 100%. However, in this general mode of operation it is also possible to adjust the final tubing wall thickness by imparting motion in either direction to that pulling rod associated with the solid tubing section from which the molten ring is moving. As an example, if the heating means of FIG. 9 are moving downwardly, motion may be imparted to rod 43 — upwardly to attenuate wall thickness and downwardly to increase wall thickness.

Figure 10:
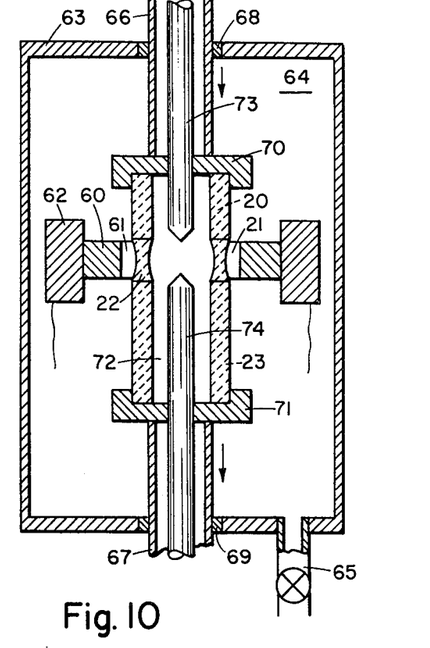
FIG. 10 is a representative, partly in cross section, of another type of incandescent heating means and the use of radiation shielding within the tubing to control the direction of heat flow.

In the apparatus of FIG. 10, means, located internally of the tubing, are provided to augment and direct the heating from an externally provided heating means. FIG. 10 also shows the reversal of the direction of tubing travel. The heating means are shown to comprise an incandescent filament 60 which may be in the form of a strip having a circular opening 61 defining the heating zone. The filament 60 is connected to two water-cooled electrodes 62 which in turn are connected to a suitable power supply, not shown. For alumina tubing the filament 60 may typically be formed of graphite to obtain temperatures between 2400 and 2800 C and of tungsten to obtain temperatures of about 3000° C. Because graphite and tungsten readily oxidize at these temperatures it is necessary to provide a non-oxidizing atmosphere surrounding the tubing and the heating zone. In the apparatus of FIG. 10 an essentially fluid-tight housing 63 provides a volume 64 which may be evacuated or charged with a gas inert to the melt and electrodes through a valve-controlled line 65. The mechanism for imparting translational (and rotational) motion to the hollow load-bearing rods 66 and 67 described in U.S. Pat. No. 3,552,931 is designed to operate with a fluid-tight housing which may be evacuated or pressurized, and provides the necessary sealing means 68 and 69 which permit the actual driving mechanism for the load bearing rods 66 and 67 to be located external of housing 63. Extending through rods 66 and 67 and chucks 70 and 71 are two radiation shield rods 73 and 74 which are positioned within the internal volume 72 of the tubing. These rods are stationary and are so positioned and configured as to direct the heat radiated by the internal wall of molten ring 22 back to the molten ring surface, thus preventing the unwanted heating of the solid tubing sections on either side of the ring and providing the maximum utility of the heat furnished in the heating zone.

Figure 11:
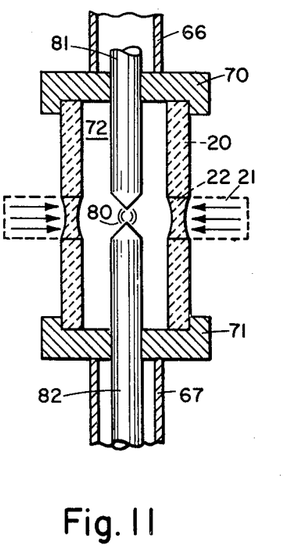
FIGS. 11–13 illustrate the use of an arc, a filament, and an r.f.-coupled graphite rod, respectively, as internally located heating means.
Figure 12:
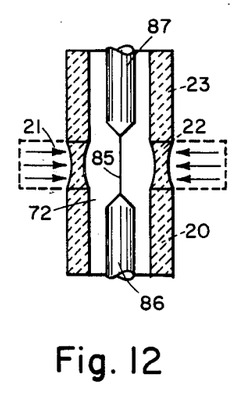

In FIG. 11, in which like reference numerals are used to refer to like elements in FIG. 10, external heating may be furnished to heating zone 21 by any of the means herein described. Separate internal heating is provided by an arc 80 established between electrodes 81 and 82 connected to a suitable power supply not shown. Likewise in the embodiment of FIG. 12, internal heating developed by a filament 85 connected between two terminals 86 and 87, which are in turn connected to a suitable power supply, may be used to augment external heating supplied to heating zone 21.

In the embodiment of FIG. 13, the tubing is held stationary in a mounting ring 90 placed on a platform 91. A graphite rod 92 is centrally positioned within internal tubing volume 72 and an r.f. coil 93 is mounted through suitable insulation members 94 and 95 to a load bearing rod which extends down through an opening in platform 91. That graphite rod section corresponding to the position of external r.f. coil 93 is directly coupled to the r.f. coil, thus generating heat internally within the tubing.

As will be apparent from the following discussion of the apparatus of FIGS. 14–18 showing the use of a laser, this type of heating means has distinct advantages for practicing the method of this invention. Where incandescent heating systems emit a large part of their radiation in a wavelength range to which many of the refractories in their molten state are transparent, the laser can be chosen to avoid the difficulty. Incandescent systems may pose problems of heat transfer to the tubing after formation; but laser energy can be directed to avoid such problems. Laser energy has no characteristic temperature of its own, and thus there are no upper temperature limitations; and the use of lasers imposes few restriction on the atmosphere in which the tubing is formed. Finally, as will be seen from the description of FIGS. 14–18, the use of a laser permits visual observation of the process.

Figure 14:
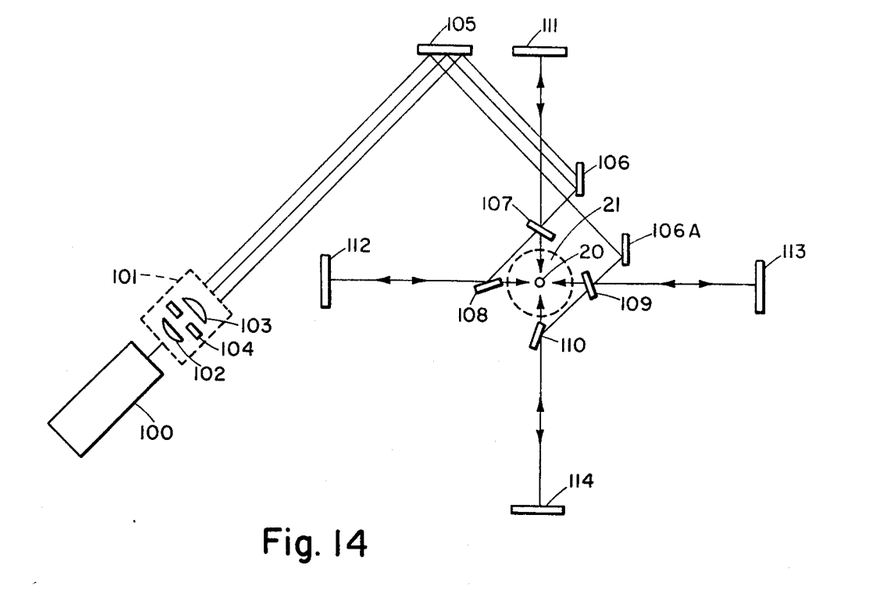
FIG. 14 is a top plan view of an optical system using a laser as the means for providing the heating zone.

FIG. 14 is a schematic representation of an optical system using a laser. Radiation from laser 100 is passed through a beam expander 101 typically formed of lenses 102 and 103 and an aperture 104. The expanded beam strikes plane mirror 105 and is reflected on plane mirrors 106 and 106A positioned such that each of these mirrors receives a half-circle of the beam. The semicircular beam from mirror 106 is interrupted by plane mirrors 107 and 108 positioned in the vertical plane such that each mirror 107 and 108 receives a quadrant of the beam. In like manner the semicircular beam from mirror 106A is interrupted by plane mirrors 109 and 110 also positioned in the vertical plane such that mirrors 109 and 110 also receive a quadrant of the beam. A quandrant is reflected from plane mirror 107 to a focusing mirror 111 which in turn is so positioned to focus the reflected beam on the molten ring located in the heating zone 21. In like manner the quandrant of the beam striking mirror 108 is reflected and focused by mirror 112, the quandrant striking mirror 109 is reflected and by mirror 113 and the quadrant striking mirror 110 is reflected and focused by mirror 114. It is possible to divide the laser beam into two or more beams for focusing in a similar manner. However, the beams should be symmetrically arranged to provide a uniform heating zone.

Figure 15:
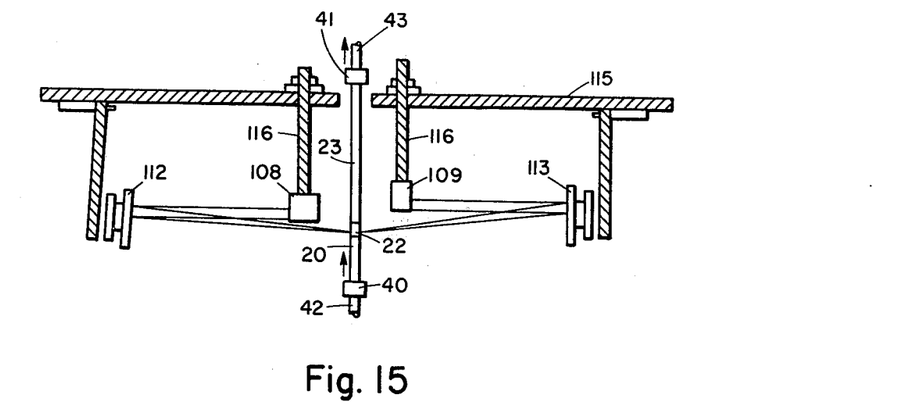
FIG. 15 is a cross sectional view through the optical system of FIG. 14 showing the spatial locations of the mirrors used.

FIG. 15 which is a cross section through the optical system shows the manner in which the plane mirrors are hung from a jig 115, by adjustable supports 116, to attain the desired vertical positioning which permits the splitting of the laser beam and its refocusing in four beams at the heating zone. The jig and focusing mirrors can be mounted in any suitable manner and the tubing is moved axially as shown in FIG. 9.

Figure 16:
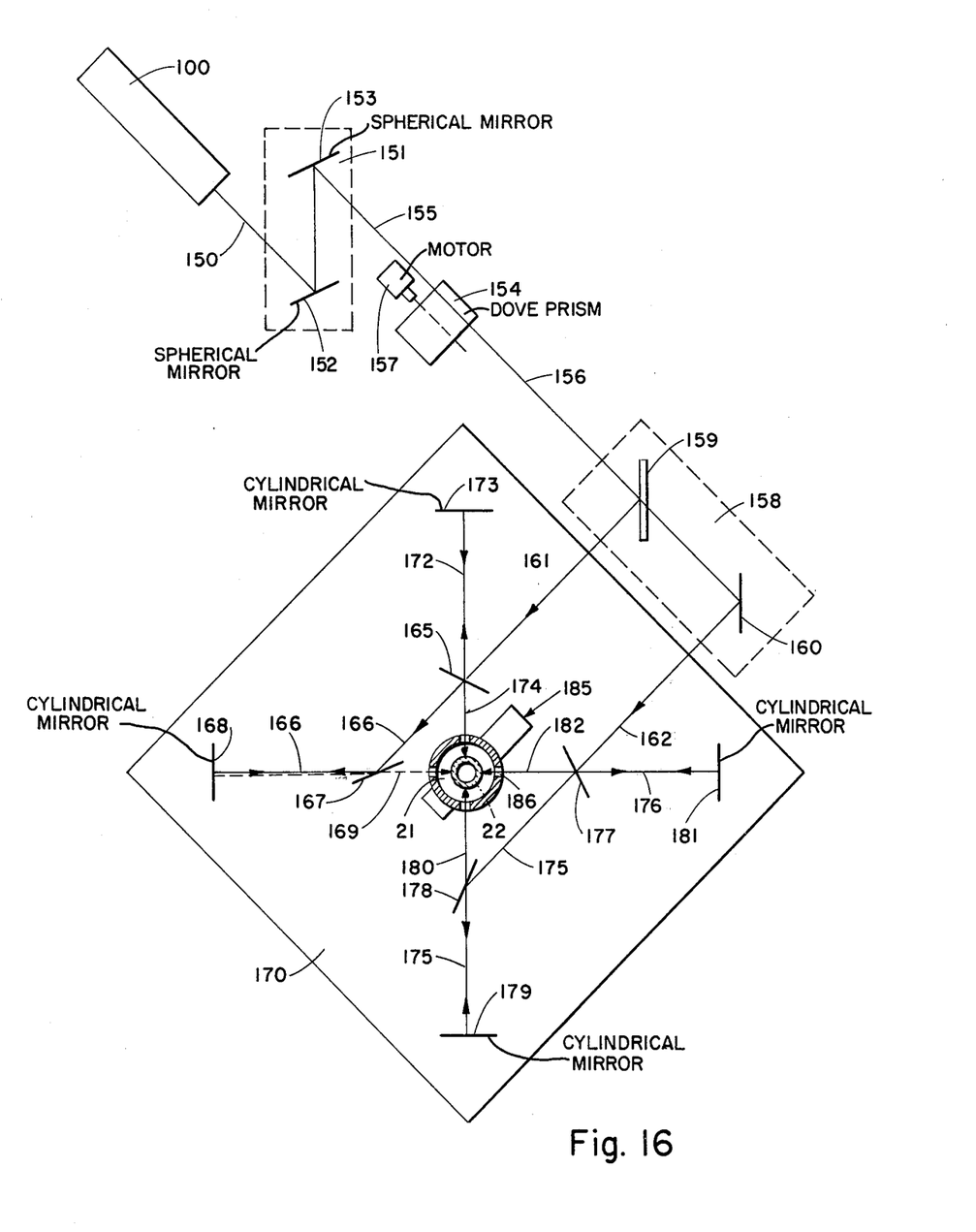
FIG. 16 is a top plan view of another optical system using a laser and including means to focus the laser beam to form four beams as lines with controlled energy densities.

FIG. 16 is an optical diagram for another embodiment of the apparatus of this invention using a laser heat source. The features of this apparatus include means to form the laser beam into an annulus, means to split the beam then into two annuli, means to redivide both annuli into half annuli and means to focus the annuli to form beams in line configurations having energy density distributions particularly suitable for heating a portion of a tubing surface.

In the apparatus of FIG. 16, the radiation beam 150 from laser 100 is first directed through a beam-expanding means 151 which comprises a spherical mirror 152 and a spherical mirror 153. By proper choice of focal length of the two spherical mirrors, it is possible to expand the laser beam by a factor of two, four or greater. A rotating Dove prism 154 is used to form the expanded beam 155 into a beam 156 having an annular configuration. Dove prisms are known and described in the literature. (See for example "Modern Optical Engineering" by Warren J. Smith, McGraw-Hill Book Co., New York, New York, 1966 page 87.) By focusing expanded beam 155 through Dove prism 154 above or below the optical axis of the prism and by rotating the prism about its axis by suitable means such as motor 157, it is possible to form the laser beam into an annular configuration.

The annular beam 156 is then passed through a beam spliter 158 which typically comprises a water-cooled, coated GaAs window 159 and a front surface mirror 160. The coating thicknesses on the surfaces of window 159 are designed to reflect 50% of the beam from the front surface of the window to form annular beam 161 and to have no reflection losses from the rear surfaces. Half of the incident beam 156 is transmitted to mirror 160 where it is reflected as annular beam 162 parallel to annular beam 161. These two annular beams are each then split to form two half-annular beams and the resulting four half-angular beams are then focused as line beams onto that portion of the tubing surface which is within the melt zone 21.

Beginning first with annular beam 161, it is directed onto a semicircular mirror 165 which is so positioned as to permit one-half of the annular beam in the form of a half-annulus beam 166 to strike plane mirror 167 for reflection to a variable focal length cylindrical mirror 168 which focuses the beam as a line (line beam 169) onto the tubing to form molten ring 22. As in the case of the apparatus of FIG. 15, the optical elements of FIG. 16 are mounted on or suspended from a support beam 170. As is well-known in optical engineering, the elements are so spatially positioned to make these optical paths possible. In FIG. 16, the line beam 169 is shown as a dotted line to show that it is distinct from half-annulus beam 166. However, it will be appreciated that these two beams are in two different planes and not side-by-side. In a similar manner, the half-annulus beam 172 is reflected by cylindrical mirror 173 which returns a line beam 184 to be directed onto the tubing to form molten ring 22. Similarly annular beam 162 is split into two half-annulus beams 175 and 176 by semicircular mirror 177; beam 175 is focused by plane mirror 178 onto cylindrical mirror 179 to be transformed into line beam 180; and half-annular beam 176 is focused by cylindrical mirror 181 into line beam 182.

A toroidal radiation shield 185 having four parts 186 to permit passage of line beams 169, 174, 180 and 182 is provided to radiate energy reflected by the molten tubing surface back to the surface to concentrate and conserve the energy used in melting the tubing. This radiation shield is described in detail in connection with the discussion of FIG. 18.

Figure 17:
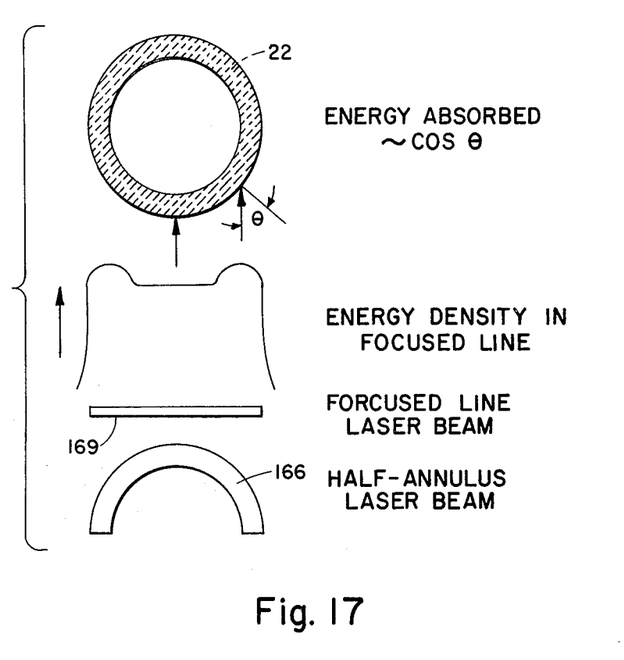
FIG. 17 illustrates in diagrammatic fashion the effect of the focusing means of FIG. 16.

FIG. 17 is presented to describe the advantages realized by the optical system of FIG. 16. When a half-annulus laser beam, such as beam 166, is focused into a line, such as line beam 169, it can be shown to have an energy density curve which peaks at or near each end of the line beam. When a beam of radiation strikes a circular surface such as that of the tubing, the amount of energy absorbed by the surface is proportional to the cosine of the angle $\theta$ formed between a line drawn normal to the tubing surface and the line of the beam. It thus becomes apparent that when a line beam having a constant energy density along its length strikes a circular surface, the portions of the surface receiving radiation from the ends of the beams will absorb less of it and therefore require longer to heat and melt while the portion of the surface receiving radiation from the central section of the beam will melt faster and perhaps even form an overheated region. However, by focusing a half-annular laser beam down to a line beam, it is possible to form a beam having increased energy densities towards it ends just where such added energy is required to overcome the differential in energy absorption as described. This is shown in FIG. 17. Hence the apparatus of FIG. 16 provides means to heat the tubing in the melt zone more uniformly around the entire periphery of the tubing, since each of the four line beams have this unique energy density distribution. It will be appreciated that the term "line beam" is used to designate a beam which has, in fact, some height, the height being controlled through the focusing of the cylindrical mirrors.

Figure 18:
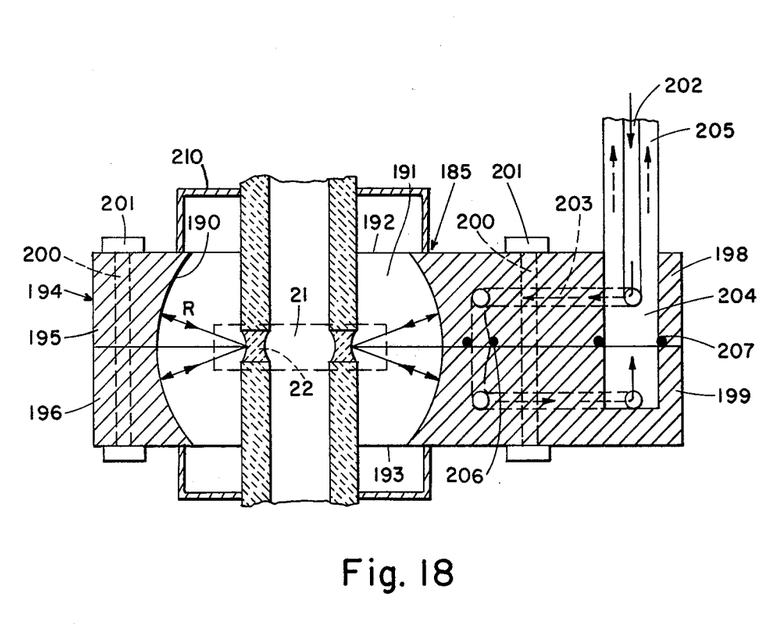
FIG. 18 is a side elevational view, partly in cross section, of the toroidal radiation shield surrounding the heating zone.

FIG. 18 illustrates an exemplary radiation shield formed to define a toroidal surface 190 surrounding the heating zone 21 and curved to return radiation reflected by or emitted from the molten ring back to the molten ring. Normally the radius of curvature R will be equivalent to or approximate the focal length of the mirror defining surface 190. This mirror is coated to produce a surface which is highly reflective to infrared radiation, such as bright gold. The toroid 191, the inner surface of which serves as mirror 190, is machined as an upper half 192 and lower mating half 193. Each of these toroid halves is also machined to have an integral joining and support means which takes the form of a shorter clamping section 194, formed of upper half 195 and lower half 196, and a longer section 197 formed of upper half 198 and lower half 199, providing means to clamp, cool and align the toroid halves. The support means must be of such dimensions that it clears ports 186 in the toroid. Clamping is accomplished with a series of bolts 200 and nuts 201, and alignment of the toroid halves and support means halves is achieved and maintained through a series of dowel pins and pin holes (not shown) in the longer sections 198 and 199 of the support means. The entire radiation shielding means 185 is preferably machined from copper and is cooled by circulation of a cooling liquid, e.g., water, through the longer supporting section halves 198 and 199. The cooling liquid is introduced through an inlet conduit 202 into one or more passages 203 and withdawn through passage 204 which terminates outside supporting section half 195 as an annular outlet conduit 205 surrounding and concentric with inlet conduit 202. Suitable sealing rings such as O-rings 206 and 207 provide adequate sealing between the mating passages in section halves 198 and 199. The radiation shielding means is supported by the base support 170 (FIG. 16) through the cooling liquid conduit 205 and hence the upper section of the shielding remains fixed with respect to the other optical components. It is therefore a simple matter to remove and replace the lower section while maintaining the desired alignment.

Since it will normally be advantageous to use a single type of laser for forming tubings of different material, the use of the radiation shielding is particularly valuable when working with materials which reflect an appreciable amount of the laser's radiation.

Figure 19:
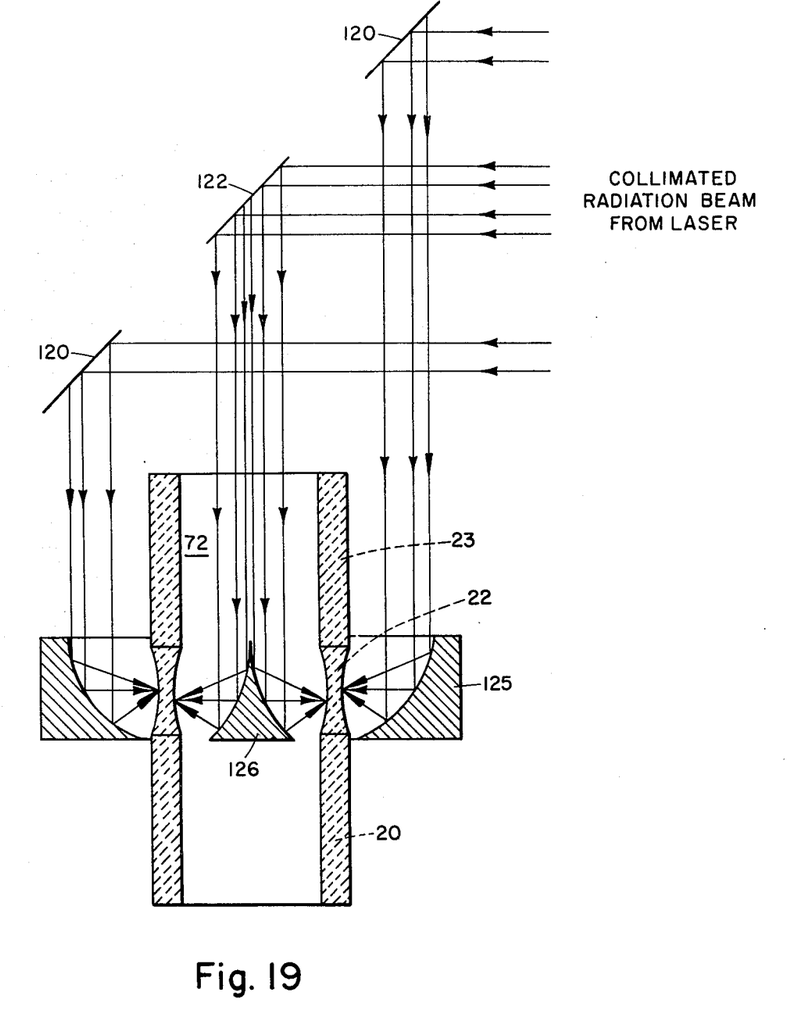
FIG. 19 is a cross section of the optics for using a laser to obtain both external and internal heating.

The apparatus of FIG. 19 uses a laser for achieving external and internal heating. The collimated radiation beam from a laser (not shown) is directed onto flat reflectors such as annular mirror 120, and central mirror 122. Positioned around the outer wall of the tubing is an annular focusing reflector 125. A reflector 126 which has a conical-like configuration is positioned internally of the tubing at the same level as annular reflector 125. In this arrangement, the radiation is directed against both the outside and inside of the tubing wall over sharply defined areas.

Figure 20:
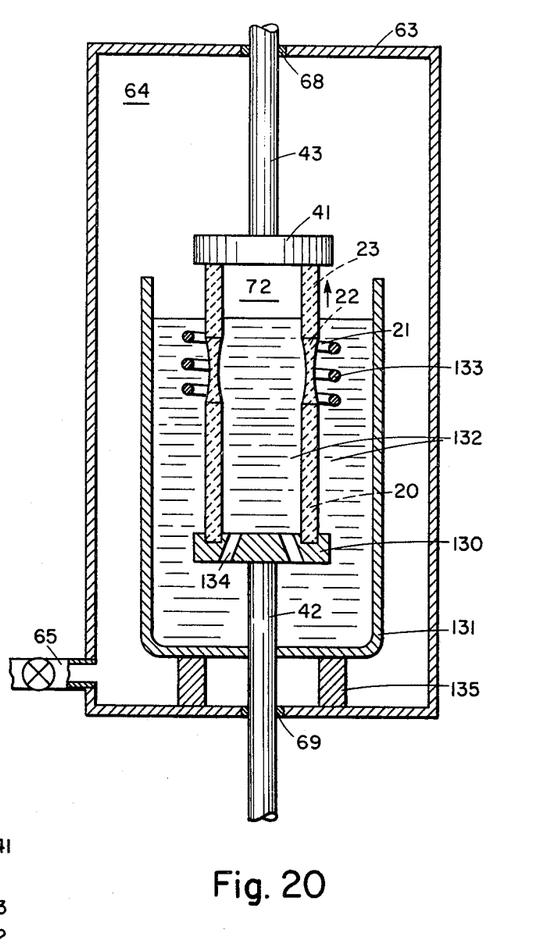
FIG. 20 illustrates in somewhat diagrammatic form the providing of a controlled fluid surroundings for the tubing during formation.

In the apparatus of FIG. 20 means are provided to control the atmosphere around the entire tubing formed system and also around the part of the system where the tubing is actually formed by passing through the heating zone. In handling some materials which contain one or more volatile components in the melt stage such as arsenic and phosphorus, it is necessary to encapsulate the melt and in some cases to work under pressures which are greater than the vapor pressure of the volatile component. In some other circumstance, it may be advantageous to be able to reduce the forces on the molten ring in forming the tubing.

The tubing forming system of FIG. 20, which uses the means for continuously supplying a feed tubing of FIG. 9, is enclosed in a fluid-tight chamber 63 such as that of FIG. 10, which may be pressurized if desired. The load bearing rod 42 on which a modified chuck 130 is mounted is introduced through the bottom of a vessel 131 containing a liquid encapsulant 132 in which is embedded an r.f. coil 133 exemplary of a suitable heating means. If the encapsulant is also to be present within the tubing, a plurality of ports 134 may be drilled in chuck 130 to permit the liquid encapsulant to flow upwardly into tubing volume 72. In the modification of FIG. 20, vessel 131 is shown to be supported on a ring support 135 within fluid-tight housing 63.

The liquid encapsulant should have a density which approximates the density of the refractory in molten form and which is inert to the melt as well as to all other material it contacts. The liquid encapsulant should also of course be compatible with the heating means and not interfere with its function. For example, in the apparatus of FIG. 20 which uses an r.f. heater the liquid encapsulant should not be electrically conducting at the frequencies employed in the heater. Exemplary of encapsulants which are suitable are boric oxide, barium oxide and these oxides in admixture with barium chloride and sodium fluoride.

The use of an encapsulant used as shown in FIG. 20 may have advantages for certain systems. For example, a liquid encapsulant, which has a density that approximates the density of the molten ring, reduces the body forces on the molten volume. Thus the surface energy is that of a liquid-liquid interface rather than that of a gas-liquid interface and hence the tendency to neck off is reduced. Such a liquid encapsulant acts as a heat sink, thus increasing the rate at which the growing tubing section may be solidified.

Figure 21:
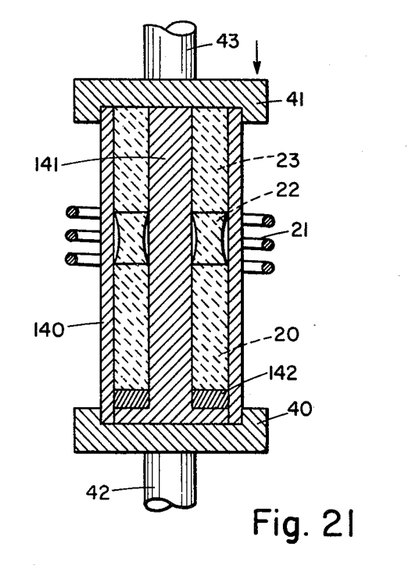
FIG. 21 illustrates the use of supporting means for the tubing.

Finally, it may be desirable in some instances to provide some type of confinement or support for the tubing during the process, particularly if the refractory material being used does not lend itself to the formation of an adequately self-supporting feed tubing configuration. The modification of the apparatus shown in FIG. 21 provides an outer supporting member 140 of any desired cross section and a mandrel 141 which corresponds in size and cross section to the inner wall of the tubing. A seed crystal 142 may be placed either at the bottom or top of the tubing, depending upon the direction in which the tubing is to be moved. It is, of course necessary to construct the outer supporting member and inner mandrel of a material which has a higher melting point than that of the refractory from which the tubing is to be formed and which is inert to it. If an r.f. coil is used as the heating means, if the outer supporting member 140 and mandrel 141 are constructed of a suitable material such as graphite and if the wall thickness of supporting member 140 is relatively small, then some internal heating of the tubing can be achieved through direct r.f. coupling of the mandrel.

From the drawings presented and from the description and discussions of these drawings, it will be apparent to those skilled in the art that a number of different heating means and combinations of heating means may be used. In a like manner, a number of different arrangements for effecting the relative motion of such heating means and the tubing are possible. Moreover, any of the apparatus embodiments illustrated or discussed may be located within a chamber, such as chamber 210 of FIG. 18 in which the fluid surroundings may be controlled during the formation of the tubing. Exemplary of apparatus which provides such a chamber is the pressure- and temperature-controlled furnace described in U.S. Pat. No. 3,639,718 and assigned to the same assignee as the present application. The various modes of operation described for the apparatus of FIG. 9 are, of course, applicable to the other apparatus embodiments and modification.

The method and apparatus of this invention may be used to form refractory tubing from any refractory material which is capable of existing in the liquid state and which can be formed into a tubing blank. In addition to alumina, such refractories include, but are not limited to, oxides such as zirconia, titania, thoria, ytteria and the like, carbides such as titanium carbide, borides such as titanium boride, intermetallics such as gallium arsenide, ternary compounds such as HgCdTe, pseudobinary compounds such as AlAs-GaAs, and elements such as boron and silicon. Both crystalline and amorphous materials may be used. For optical applications, it is generally necessary to use materials of extremely high purity. For other applications it may be desirable to have dopants, such as titanium or other additives present in minor amounts.

The feed tube blank used to produce the polycrystalline or single crystal tubing may be prepared by any suitable technique such as for example by slip casting, or by pressing the refractory in powder force (with or without a heat-removable binder) under sufficient pressure to form a self-supporting structure. This pressed structure may, if desired, be partially sintered to enhance its structural strength. Tubing blanks of presintered materials, e.g., $Al_2O_3$, are available commercially. (See also, for example, "Introduction to Ceramics" by W. D. Kingery, John Wiley & Sons, Inc., New York, 1960, particularly Chapter 3 on "Forming Processes" which describes in detail such forming processes as powder pressing, extrusion, slip casting and sintering.) In view of the well developed art in the formation of ceramic or refractory bodies, the choice of such parameters as particle size, binders, and density of the material making up the feed tubing is within the skill of the artisan in this field; and the choice of the method by which the feed tubing is formed is also within his skill. As noted above in the description of FIG. 21, it may under some circumstances be desirable to provide some physical support to the feed tube blank in the form of an outer supporting member and centrally positioned mandrel.

The temperature attained within the heating zone must, of course, be that which is sufficient to melt the tubing. Although somewhat higher temperature can be tolerated, the temperature should be maintained somewhat below that level which would cause vaporization or boiling off of the molten material under the environmental conditions being used. The temperature range, which is readily determinable from existing physical data, will depend upon the refractory material from which the tubing is formed.

The height of the travelling molten ring is controlled by well-known physical factors, i.e., the existing temperature gradient which is a function of the thermal conductivity of the tubing material and the environmental surrounding the tubing. As noted above this environment may include the ambient atmosphere, an inert pressurized gas with or without a liquid encapsulant, or a gas providing a special type of atmosphere, e.g., reducing or oxidizing. In addition, the use of radiation shielding to return reflected radiation to the molten zone represents another factor in the environment. The growth rate of the finished tubing is, of course, equal to the withdrawal rate, $v_b$.

Because the method of this invention involves the melting of the tubing, it permits the selection of any desirable atmosphere to achieve such results as purification of the refractory material and adjusting the valence state of any additives. For example, if the process is carried out in an oxidizing atmosphere it is possible to convert to or maintain a titanium dopant in its higher valence state, i.e., $Ti^{+4}$. Other types of environments may, of course, be used to attain other desired results.

The method of this invention may be further illustrated by the following examples which are meant to be illustrative and not limiting.

A two-inch length of a commercially available sintered polycrystalline alumina tubing (0.999% $Al_2O_3$) having an outside diameter of 0.24 inch and an inside diameter of 0.162 inch (sold by Degussa Inc., as AP35) was placed in an apparatus constructed as shown in FIG. 9. The incandescent filament used was a graphite washer. The top and bottom pulling rods were moved at 3 inches per hour while the heating zone was maintained stationary. At the completion of zone melting the tubing had an outside diameter of 0.226 while the inside diameter remained essentially the same. A second tubing sample of alumina tubing having an outside diameter of 0.084 inch and inside diameter of 0.053 inch was treated in the same manner. After zone melting was completed, it had an outside diameter of 0.082 and an inside diameter of 0.049.

The reduction in wall thickness from 0.039 to 0.032 inch in the first example illustrates the densifying of the alumina into a structure of reduced porosity; while the decrease in outside diameter and inside diameter with an accompanying shortening of the tube length confirmed the densifying of the second sample.

A preformed open-ended alumina tubing (sold as Al-23 by Degussa Inc.) was externally ground down to have an outside diameter of 0.375 inch. It has an inside diameter of 0.315 inch and wall thickness of 0.030 inch. The alumina in the tubing as purchased had a density of between 3.7 and 3.0 grams per $cm^3$. This tubing was treated in an apparatus such as shown in FIG. 9 in an argon atmosphere. The tubing was affixed by chucks between upper and lower pulling rod was moved upwardly at a speed which was 1.25 times the speed at which the lower rod was moved upwardly. The tubing was not rotated. Molten ring formation was started part way up the tubing and the growth rate (ring movement) was 5.2 inches/hour. Inasmuch as the upper pulling rod was moved at a higher speed than the lower rod, there was attenuation of the tubing, as evidenced by the fact that the finished tubing had an outside diameter of 0.332 inch, an inside diameter of 0.302 inch and a wall thickness of 0.015 inch. The finished tube was translucent and had a density approaching theoretical for $Al_2O_3$.

An open-ended tubing, commercially available for Degussa Inc. as Al-23, was processed in the apparatus shown in FIG. 16. The tubing as purchased had an outside diameter of 0.401 inch, an inside diameter of 0.285 inch and wall thickness of 0.058. A $CO_2$ laser (10.6 $\mu$m radiation) was used as the heat source and a solid rod of $Al_2O_3$ was used as the starting contacting member as shown in FIG. 8. The load-bearing rods were rotated at 95 rpm, and the speed of the upper one was 1.6 times that of the lower one to achieve attenuation. Growth rate was 7 inches/hour and the environment was ambient air. The resulting tubing was translucent and had a density approaching theoretical for $Al_2O_3$.

The method and apparatus of this invention thereby provide for upgrading of a refractory tubing structure and, if desired, for the forming of such a structure in the form of a single crystal, a form which possesses operational advantages when the resulting cyrstalline tubing is used as an enclosure for high-pressure lights.

It will thus be seen that the objects set forth above, among those made apparent from the preceding description, are efficiently attained and, since certain changes may be made in carrying out the above method and in the constructions set forth without departing from the scope of the invention, it is intended that all matter contained in the above description as shown in the accompanying drawings shall be interpreted as illustrative and not in a limiting sense.

I claim:

1. An apparatus for forming refractory tubing, comprising in combination
   a. tube holding means adapted to hold each end of a refractory tubing separately;
   b. heating means for forming a molten ring in said refractory tubing, said ring being of essentially uniform height throughout said tubing said height being such that the forces of surface tension and gravity maintain said molten ring connected to the solid sections of said tubing, said heating means comprising 1. laser means providing at least one beam of radiant energy;
2. optical means including means for expanding said beam, means for splitting the resulting expanded beam into a plurality of beams essentially equally spaced around the surface of said tubing, and means for focusing each of said plurality of beams onto said surface of said tubing within a heating zone surrounding said tubing and providing essentially uniform heating of said tubing surface; and c. means to effect controlled translational movement of said tube holding means whereby said molten ring advances through said tubing.

2. An apparatus in accordance with claim 1 including additional heating means located internally of said tubing.

3. An apparatus in accordance with claim 1 wherein said means to effect controlled movement comprises means associated with each end of said tubing to impart translational motion to said solid tubing sections joined through said molten ring.

4. An apparatus in accordance with claim 1 wherein said means to impart translational motion to one of said tubing sections is adapted to move its associated section at a speed different from that at which said other section is moved.

5. An apparatus in accordance with claim 1 including means to provide controlled fluid surroundings around at least said tubing and said heating zone.

6. An apparatus in accordance with claim 5 wherein said means to provide controlled fluid surroundings comprises fluid-tight housing means adapted for evacuation or gas pressurization.

7. An apparatus in accordance with claim 1 including mandrel means positioned within said tubing.

8. An apparatus in accordance with claim 1 including means to effect synchronized rotational movement of said tube holding means associated with each end of said tubing.

9. An apparatus in accordance with claim 1 including radiation shielding means surrounding said heating zone and being adapted to reflect radiant energy reflected from said molten ring back to said molten ring.

10. An apparatus in accordance with claim 1 wherein said optical means include energy distribution means to adjust the energy density distribution of each of the beams making up said plurality of beams to essentially equalize the absorption of said radiant energy around the entire surface of said tubing within said molten ring.

11. An apparatus for forming refractory tubing, comprising in combination
    a. tube holding means adapted to hold each end of a refractory tubing separately;
    b. laser means providing at least one beam of radiant energy;
    c. beam expanding means for expanding said beam of radiant energy;
    d. means to convert the resulting expanded beam into a beam of annular configuration;
    e. beam splitting means for splitting said beam of annular configuration into two beams of annular configuration;
    f. means to form four beams of half-annular configuration from said two beams of annular configuration;
    g. cylindrical mirror means to focus said four beams of half-annular configuration as line beams onto the surface of said refractory tubing whereby to adjust the energy distribution of each of said four beams so as to essentially equalize the absorption of said radiant energy around the entire surface of said tubing and form therein a molten ring of a height such that the forces of surface tension and gravity maintain said molten ring connected to the solid sections of said tubing; and
    h. means to effect controlled translational movement of said tube holding means whereby said molten ring advances through said tubing.

12. An apparatus in accordance with claim 11 including radiation shielding means surrounding said heating zone and being adapted to reflect radiant energy reflected and emitted from said molten ring back to said molten ring.

13. An apparatus in accordance with claim 12 wherein said radiation shielding means is toroidal.

14. An apparatus in accordance with claim 11 wherein said means to convert said resulting expanded beam into a beam of annular configuration comprises a rotatable Dove prism and means to rotate said prism.

15. An apparatus in accordance with claim 11 wherein said means to form four beams of half-annular configuration comprises spatially arranged mirrors.

* * * * *